United States Patent
Yu et al.

(10) Patent No.: US 12,055,821 B2
(45) Date of Patent: Aug. 6, 2024

(54) STRUCTURE AND METHOD OF BI-LAYER PIXEL ISOLATION IN ADVANCED LCOS BACK-PLANE

(71) Applicant: Applied Materials, Inc., Santa Clara, CA (US)

(72) Inventors: Lan Yu, Albany, NY (US); Benjamin D. Briggs, Clifton Park, NY (US); Tyler Sherwood, Fonda, NY (US); Zihao Yang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 452 days.

(21) Appl. No.: 17/100,400

(22) Filed: Nov. 20, 2020

(65) Prior Publication Data
US 2022/0163834 A1 May 26, 2022

(51) Int. Cl.
*H01L 21/66* (2006.01)
*G02F 1/1339* (2006.01)
(Continued)

(52) U.S. Cl.
CPC .... *G02F 1/13394* (2013.01); *H01L 21/67207* (2013.01); *H01L 21/67225* (2013.01);
(Continued)

(58) Field of Classification Search
CPC ........... G02F 1/13394; G02F 1/133553; G02F 1/136227; G02F 1/136277; G02F 2201/307; G02F 2202/022; H01L 21/67207; H01L 21/67225; H01L 22/26; H01L 23/5226; H01L 23/53219; H01L 23/53276;
(Continued)

(56) References Cited

U.S. PATENT DOCUMENTS

| 5,170,407 A | 12/1992 | Schubert et al. |
| 5,892,563 A | 4/1999 | Ono et al. |

(Continued)

FOREIGN PATENT DOCUMENTS

| CN | 101398579 B | 6/2010 |
| CN | 101866083 B | 5/2012 |

(Continued)

OTHER PUBLICATIONS

International Search Report and Written Opinion mailed Mar. 4, 2022 in International Patent Application No. PCT/US2021/059737, 8 pages.

(Continued)

*Primary Examiner* — Yu-Hsi D Sun
(74) *Attorney, Agent, or Firm* — Kilpatrick Townsend & Stockton LLP

(57) ABSTRACT

Processing methods may be performed to form a pixel isolation structure on a semiconductor substrate. The method may include forming a pixel isolation bilayer on the semiconductor substrate. The pixel isolation bilayer may include a high-k layer overlying a stopping layer. The method may include forming a lithographic mask on a first region of the pixel isolation bilayer. The method may also include etching the pixel isolation bilayer external to the first region. The etching may reveal the semiconductor substrate. The etching may form the pixel isolation structure.

13 Claims, 8 Drawing Sheets

(51) Int. Cl.
    H01L 21/67      (2006.01)
    H01L 23/522     (2006.01)
    H01L 23/532     (2006.01)
    H01L 29/423     (2006.01)
    H01L 31/20      (2006.01)
    H01L 33/46      (2010.01)
    H10K 59/50      (2023.01)
    H10N 10/855     (2023.01)
    G02F 1/1335     (2006.01)
    G02F 1/1362     (2006.01)
    H01L 21/311     (2006.01)

(52) U.S. Cl.
    CPC .......... *H01L 22/26* (2013.01); *H01L 23/5226* (2013.01); *H01L 23/53219* (2013.01); *H01L 23/53276* (2013.01); *H01L 29/42368* (2013.01); *H01L 31/206* (2013.01); *H01L 33/46* (2013.01); *H01L 33/465* (2013.01); *H10K 59/50* (2023.02); *H10N 10/855* (2023.02); *G02F 1/133553* (2013.01); *G02F 1/136227* (2013.01); *G02F 1/136277* (2013.01); *H01L 21/31122* (2013.01); *H01L 2224/05181* (2013.01); *H01L 2224/05184* (2013.01)

(58) Field of Classification Search
    CPC . H01L 29/42368; H01L 31/206; H01L 33/46; H01L 33/465; H01L 21/31122; H01L 2224/05181; H01L 2224/05184; H01L 22/12; H10K 59/50; H10N 10/855
    See application file for complete search history.

(56) References Cited

U.S. PATENT DOCUMENTS

| | | | |
|---|---|---|---|
| 5,903,058 A | 5/1999 | Akram | |
| 6,008,876 A * | 12/1999 | Moore | G02F 1/13439 |
| | | | 430/311 |
| 6,333,519 B1 | 12/2001 | Nakazawa | |
| 6,356,332 B1 | 3/2002 | Ichikawa et al. | |
| 6,435,942 B1 | 8/2002 | Jin et al. | |
| 6,577,362 B1 | 6/2003 | Moore | |
| 6,795,144 B1 | 9/2004 | Okuda et al. | |
| 7,928,579 B2 | 4/2011 | Wark et al. | |
| 11,322,910 B2 | 5/2022 | Park et al. | |
| 11,573,452 B2 | 2/2023 | Yu et al. | |
| 11,586,067 B2 | 2/2023 | Yu et al. | |
| 2001/0045999 A1* | 11/2001 | Nakazawa | G02F 1/136227 |
| | | | 349/42 |
| 2002/0126233 A1 | 9/2002 | Yamagishi et al. | |
| 2002/0175414 A1* | 11/2002 | Teh | H01L 23/5226 |
| | | | 257/E23.152 |
| 2004/0017537 A1 | 1/2004 | Magana et al. | |
| 2005/0134753 A1 | 6/2005 | Higuchi et al. | |
| 2007/0026557 A1 | 2/2007 | Yu et al. | |
| 2007/0026679 A1 | 2/2007 | Yu et al. | |
| 2007/0170430 A1 | 7/2007 | Nakagawa | |
| 2007/0175104 A1 | 8/2007 | Nishiyama et al. | |
| 2007/0262463 A1 | 11/2007 | Akram | |
| 2007/0284627 A1 | 12/2007 | Kimura | |
| 2007/0287211 A1 | 12/2007 | Wu | |
| 2011/0237009 A1 | 9/2011 | Huang et al. | |
| 2012/0081645 A1* | 4/2012 | Yoshimura | G02F 1/136209 |
| | | | 445/24 |
| 2013/0027651 A1* | 1/2013 | Meldrim | G02F 1/133553 |
| | | | 359/263 |
| 2015/0048514 A1 | 2/2015 | Tang et al. | |
| 2016/0111324 A1* | 4/2016 | Chiu | H01L 21/76813 |
| | | | 438/653 |
| 2017/0075166 A1 | 3/2017 | Son et al. | |
| 2018/0190878 A1 | 7/2018 | Li et al. | |
| 2018/0337090 A1* | 11/2018 | Shen | H01L 21/76811 |
| 2018/0351035 A1 | 12/2018 | Chung et al. | |
| 2019/0164944 A1 | 5/2019 | Chae et al. | |
| 2020/0152691 A1 | 5/2020 | Lee | |
| 2022/0163707 A1 | 5/2022 | Yu et al. | |
| 2022/0163834 A1 | 5/2022 | Yu et al. | |
| 2022/0163845 A1 | 5/2022 | Yu et al. | |
| 2022/0163846 A1 | 5/2022 | Yu et al. | |
| 2022/0165912 A1 | 5/2022 | Yu et al. | |
| 2022/0223402 A1 | 7/2022 | Yu et al. | |
| 2022/0283452 A1 | 9/2022 | Nelson | |
| 2022/0285425 A1 | 9/2022 | Young et al. | |

FOREIGN PATENT DOCUMENTS

| | | | |
|---|---|---|---|
| CN | 108845442 A | | 11/2018 |
| JP | 2000-124313 A | | 4/2000 |
| JP | 2007-193200 A | | 8/2007 |
| JP | 2007193200 A | * | 8/2007 |
| JP | 2011-123093 A | | 6/2011 |
| TW | 200415550 A | | 8/2004 |
| TW | 200744127 A | | 12/2007 |
| TW | 200834197 A | | 8/2008 |
| TW | 200842400 A | | 11/2008 |
| TW | 200916406 A | | 4/2009 |
| TW | 201001009 A | | 1/2010 |
| TW | 201218274 A | | 5/2012 |
| TW | 202039719 A | | 11/2020 |
| WO | 2020-008765 A1 | | 1/2020 |

OTHER PUBLICATIONS

International Search Report and Written Opinion mailed Mar. 8, 2022 in International Patent Application No. PCT/US2021/059744, 8 pages.
International Search Report and Written Opinion mailed Mar. 15, 2022 in International Patent Application No. PCT/US2021/059756, 6 pages.
International Search Report and Written Opinion mailed Mar. 15, 2022 in International Patent Application No. PCT/US2021/059752, 6 pages.
International Search Report and Written Opinion mailed Apr. 29, 2022 in International Patent Application No. PCT/US2022/011847, 7 pages.
Application No. PCT/US2021/059737 , International Preliminary Report on Patentability, Mailed On Jun. 1, 2023, 6 pages.
Application No. PCT/US2021/059744 , International Preliminary Report on Patentability, Mailed On Jun. 1, 2023, 6 pages.
Application No. PCT/US2021/059752 , International Preliminary Report on Patentability, Mailed On Jun. 1, 2023, 5 pages.
Application No. PCT/US2021/059756 , International Preliminary Report on Patentability, Mailed On Jun. 1, 2023, 5 pages.
Application No. PCT/US2022/011847 , International Preliminary Report on Patentability, Mailed On Jul. 27, 2023, 6 pages.

\* cited by examiner

STRUCTURE AND METHOD OF BI-LAYER PIXEL ISOLATION IN ADVANCED LCOS BACK-PLANE

CROSS-REFERENCES TO RELATED APPLICATIONS

The present technology is related to the following applications, all concurrently filed Nov. 20, 2020, and titled: "STRUCTURE AND METHOD OF ADVANCED LCOS BACK-PLANE HAVING HIGHLY REFLECTIVE PIXEL VIA METALLIZATION", application Ser. No. 17/100,402, filed Nov. 20, 2020, "STRUCTURE AND METHOD OF ADVANCED LCOS BACK-PLANE HAVING ROBUST PIXEL VIA METALLIZATION", application Ser. No. 17/100,407, filed Nov. 20, 2020, "STRUCTURE AND METHOD OF MIRROR GROUNDING IN LCOS DEVICES", application Ser. No. 17/100,416, filed Nov. 20, 2020, and "METHOD FOR LCOS DBR MULTLAYER STACK PROTECTION VIA SACRIFICIAL HARDMASK FOR RIE AND CMP PROCESSES", application Ser. No. 17/100,422, filed Nov. 20, 2020. The present technology is also related to "METHOD OF CMP INTEGRATION FOR IMPROVED OPTICAL UNIFORMITY IN ADVANCED LCOS BACK-PLANE", application Ser. No. 17/149,399, filed Jan. 14, 2021, filed Each of these applications is hereby incorporated by reference in their entirety for all purposes.

TECHNICAL FIELD

The present technology relates to semiconductor systems, processes, and equipment. More specifically, the present technology relates to processes and systems for forming and etching material layers on a semiconductor substrate.

BACKGROUND

Advanced liquid crystal on silicon (LCoS) devices are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Layer thicknesses of reflective LCoS structures may have significant impact on overall device performance. As such, precise control of etch processes is desirable for maintaining layer thicknesses within design parameters. For display systems, LCoS devices may incorporate a pixel isolation (PI) material, which creates an etch challenge to remove some of the isolation material without over-etching into the reflective LCoS structures, and impair a precise optical thickness of the LCoS layers.

Thus, there is a need for improved systems and methods that can be used to produce high quality devices and structures. These and other needs are addressed by the present technology.

SUMMARY

Processing methods may be performed to form a pixel isolation structure on a semiconductor substrate. The method may include forming a pixel isolation bilayer on the semiconductor substrate. The pixel isolation bilayer may include a high-k layer overlying a stopping layer. The method may include forming a lithographic mask on a first region of the pixel isolation bilayer. The method may also include etching the pixel isolation bilayer external to the first region. The etching may reveal the semiconductor substrate. The etching may form the pixel isolation structure.

In some embodiments, the semiconductor substrate may be or include a liquid crystal on silicon (LCoS) back-plane. The stopping layer may be or include an etch-stop material. The etch-stop material may be selected to generate, during the etching of the pixel isolation bilayer, an optical emission spectroscopy (OES) signal of the etch-stop material different from an OES signal of the high-k layer. The stopping layer may be or include silicon carbon nitride. Etching the pixel isolation bilayer may include etching the pixel isolation bilayer with a first etch process. Etching the pixel isolation bilayer may include detecting an OES signal of the stopping layer. The OES signal of the stopping layer may be generated by etching the stopping layer. Etching the pixel isolation bilayer may also include etching the stopping layer with a second etch process. The second etch process may be selective for the stopping layer over the high-k layer. The stopping layer may be or include a diffusion barrier material. The diffusion barrier material may be selected to provide a barrier to diffusion of oxygen into the semiconductor substrate while etching the pixel isolation bilayer. The diffusion barrier material may be selected to provide a barrier to diffusion of atoms from the semiconductor substrate into the high-k layer while forming the lithographic mask. Etching the pixel isolation bilayer may reveal a pixel via. The pixel via may be or include copper.

The present technology also encompasses semiconductor structures including a semiconductor substrate. The structures may include a stopping layer overlying a first region of the semiconductor substrate. The structures may include a high-k layer overlying the stopping layer. The structures may also include a lithographic mask overlying the high-k layer.

In some embodiments, the stopping layer may be or include an etch-stop material. The etch-stop material may be selected to generate, during a reactive ion etch process of the stopping layer, an optical emission spectroscopy (OES) signal of the stopping layer different from an OES signal of the high-k layer. The stopping layer may be or include silicon carbon nitride. The semiconductor substrate may be or include a liquid crystal on silicon (LCoS) back-plane. the semiconductor substrate may be or include a tungsten pixel via. The high-k layer may be or include tantalum oxide. The semiconductor structure may exhibit an over-etch less than 2 nm, estimated relative to an upper surface of the lithographic mask and an upper surface of the semiconductor substrate.

The present technology also encompasses semiconductor structures including a semiconductor substrate including a pixel via. The structures may also include a pixel isolation bilayer. The pixel isolation bilayer may include a barrier layer overlying the semiconductor substrate. The pixel isolation bilayer may also include a high-k layer overlying the barrier layer.

In some embodiments, the pixel via may be or include a non-refractory metal. The pixel via may be or include aluminum. The pixel via may be or include copper. The barrier layer may be or include a material selected to provide a barrier to diffusion of oxygen into the pixel via during a reactive ion etch process. The barrier layer may be or include a material selected to provide a barrier to diffusion of atoms from the pixel via into the high-k layer during a deposition process. The barrier layer may be or include tantalum nitride. The high-k layer may be or include tantalum oxide.

Such technology may provide numerous benefits over conventional systems and techniques. For example, embodiments of the present technology may reduce over etch of multilayer oxide structures during fabrication, and may improve feature consistency over a wafer scale. These and other embodiments, along with many of their advantages and features, are described in more detail in conjunction with the below description and attached figures.

Figure 1:
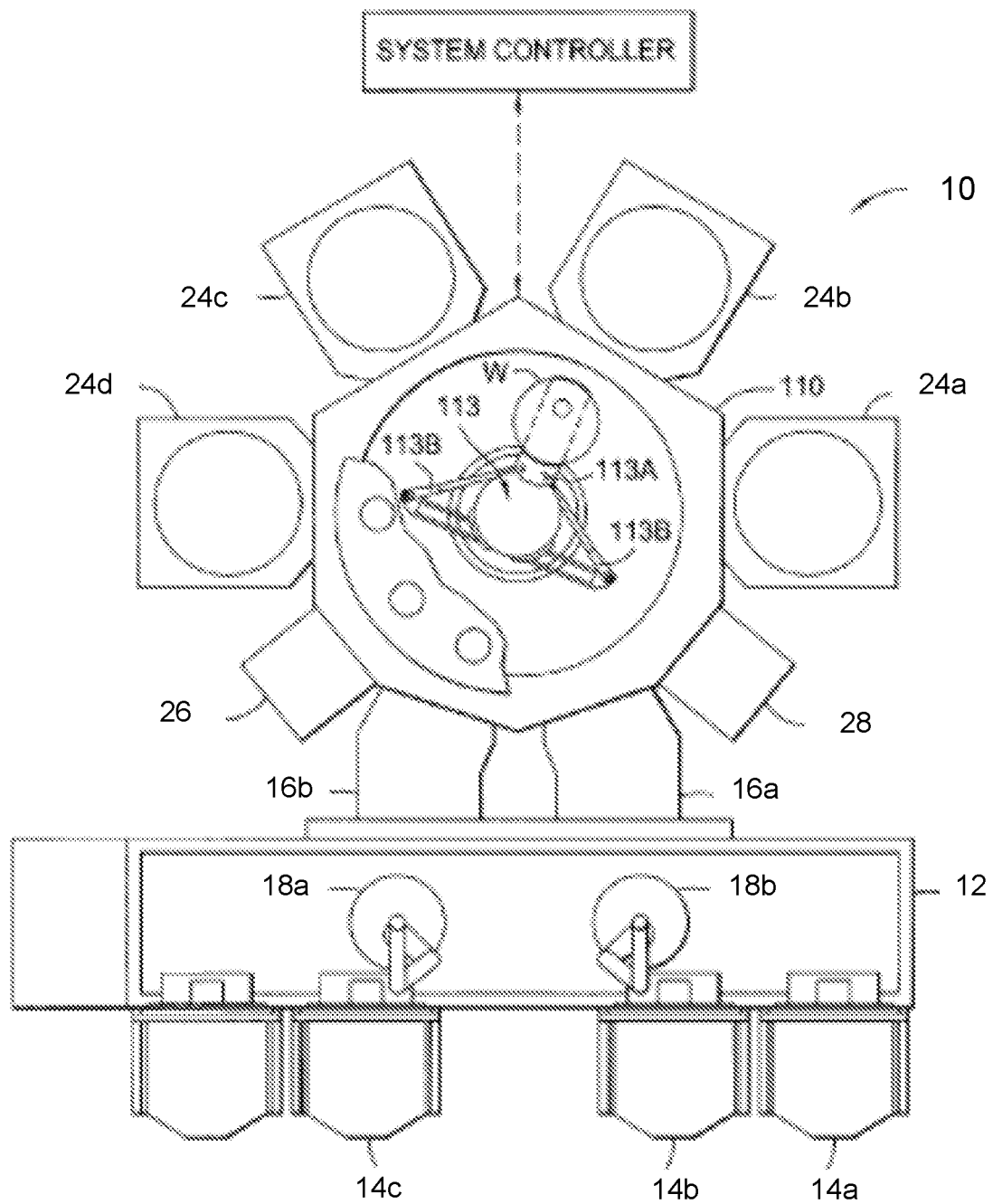
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of liquid crystal on silicon (LCoS) back-plane devices. Semiconductor structures built with an embedded distributed Bragg reflector (DBR) can have dramatically enhanced optical performance for increased display brightness and lower power consumption relative to other reflective back-plane structures for liquid crystal displays. Incorporating a DBR layer in the LCoS back-plane can add complexity to fabrication processes, and may create challenges for integration with subsequent processing steps. For example, a pixel isolation (PI) material and the topmost layer of the DBR may each be or include high-k materials, which may be of similar chemical composition or may be formed of the same material. A lack of chemical differentiability between the DBR and the PI material may in turn introduce difficulties in controlling an etch process, and may result in removal of DBR material during an etch process designed to remove the PI material. DBR layers are designed and fabricated to precise tolerances, such that over-etching can shift the precise optical thickness of the DBR and negatively impact the optical performance of the LCoS back-plane.

The present technology overcomes such limitations through an improved etch process for removal of the PI material. In some embodiments, wafer scale methods are provided to remove the isolation material to define the pixel and reveal a pixel via, while not over-etching and removing material from the DBR. For example, a stopping layer may be formed on the DBR and the pixel via as part of the PI material, forming a pixel isolation bilayer. In some embodiments, the stopping layer may exhibit high etch selectivity under specific etch conditions. In some embodiments, the stopping layer may act as a diffusion barrier to metals or oxygen.

The process of defining the pixel may include an end-pointed reactive ion etch (RIE) operation, facilitated by the stopping layer. In some embodiments, etching the stopping layer may be detected in optical emission spectroscopy (OES) signals measured during removal of the PI material, which may be defined as an endpoint to an RIE process that is selective for the high-k material of which the DBR and the PI material may be formed. In this way, once the endpoint is detected in OES signals, a second RIE operation may be implemented, with high selectivity for the stopping layer material over the high-k material that may reduce the over-etch of the DBR while still revealing the pixel via metal. The process may also provide uniformity of treatment on a wafer scale, as measured by a center-to-edge over-etch delta. In some cases, the center-to-edge over-etch delta may approach the inherent variability of the DBR layer, and as such may be negligible over the area of the wafer.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
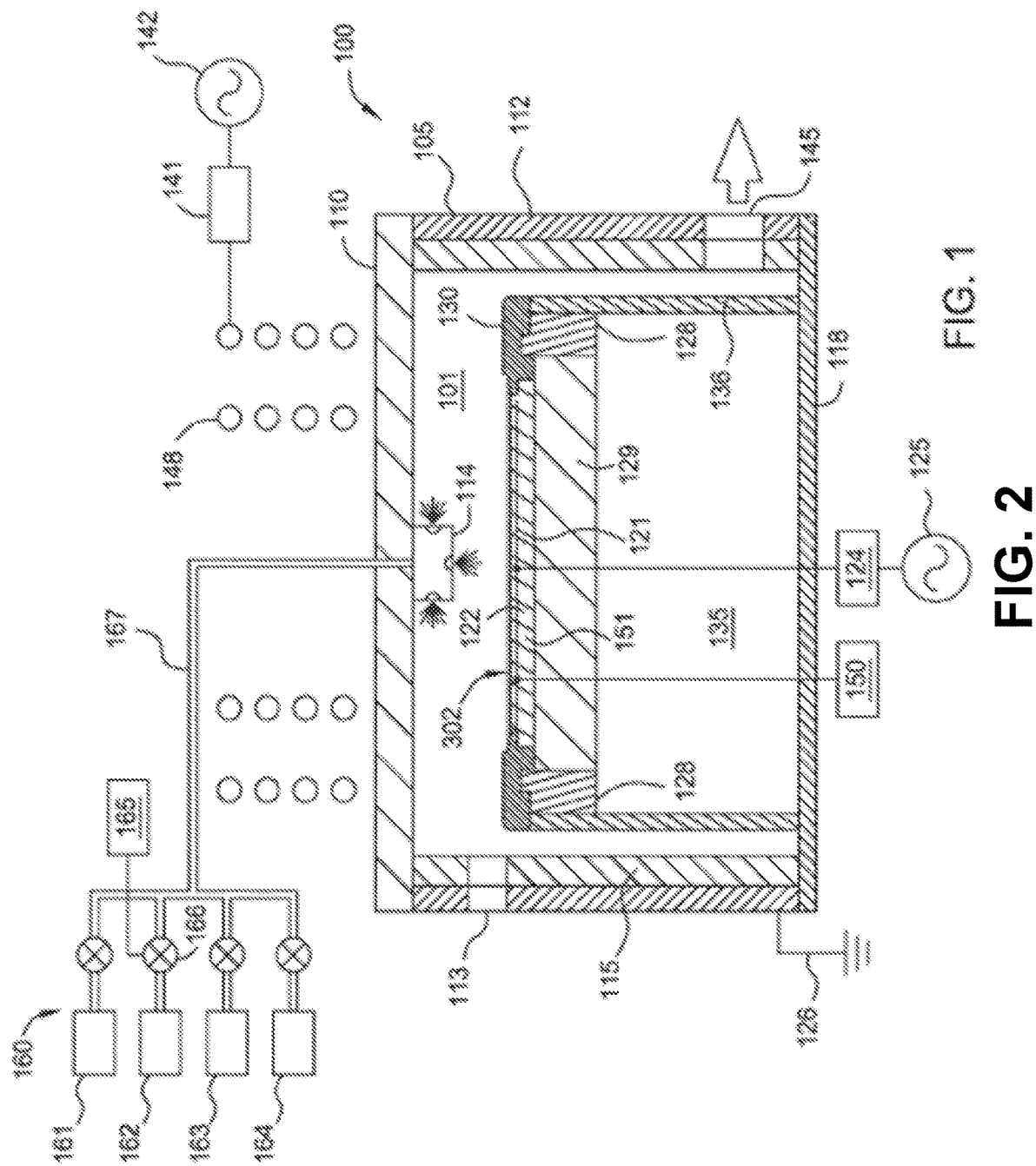
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, tetrafluoromethane, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, Na, $NO_2$, $N_2O$, and Hz, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
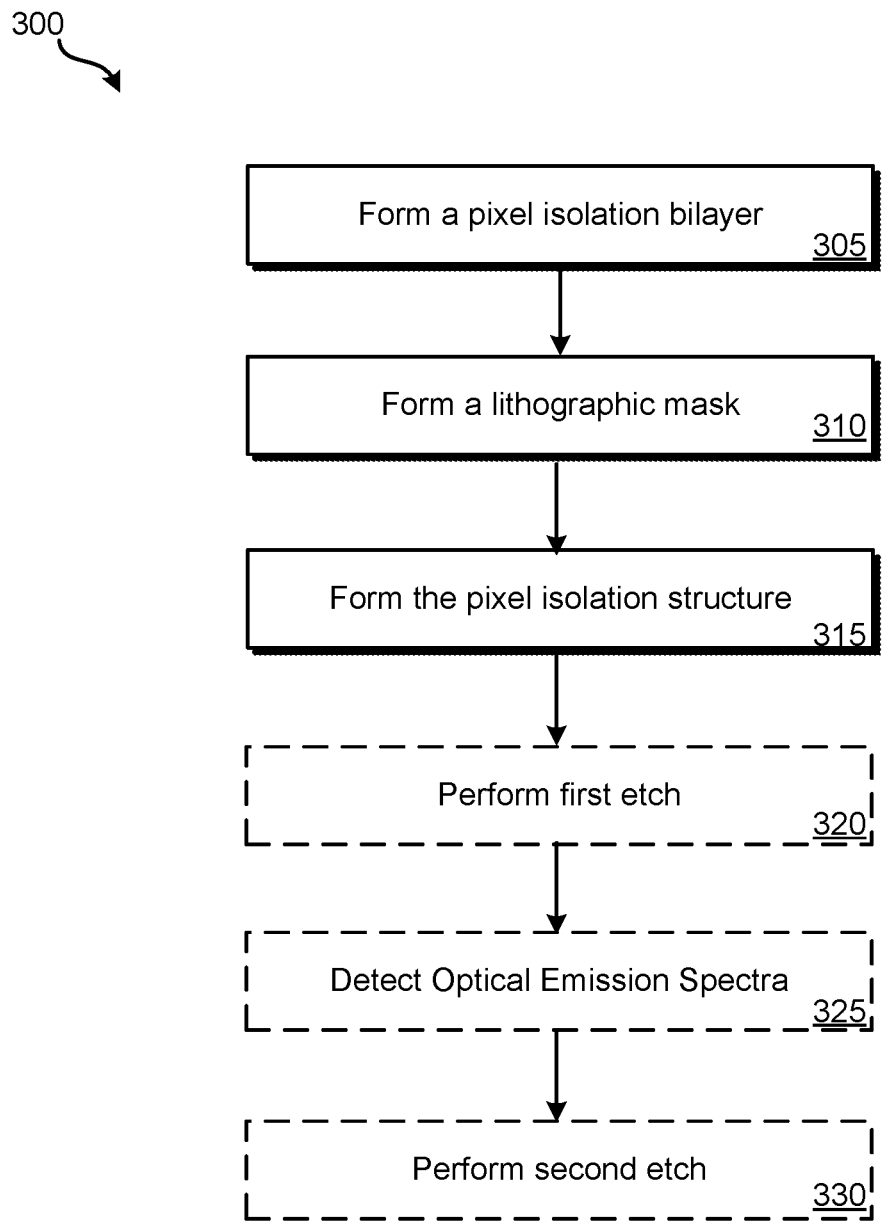
FIG. 3 shows selected operations in a method of forming a pixel isolation structure on a semiconductor substrate according to some embodiments of the present technology.

FIG. 3 shows selected operations in a method 300 of forming a pixel isolation structure on a semiconductor substrate according to some embodiments of the present technology. Many operations of method 300 may be performed, for example, in the chamber 100 as previously described. Method 300 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4E, the illustrations of which will be described in conjunction with the operations of method 300. It is to be understood that FIG. 4 illustrates only partial schematic views, and a substrate may contain any number of semiconductor sections having aspects as illustrated in the figures, as well as alternative structural aspects that may still benefit from aspects of the present technology. Method 300 may involve optional operations to develop the semiconductor structure 400 to a particular fabrication operation.

Figure 4A:
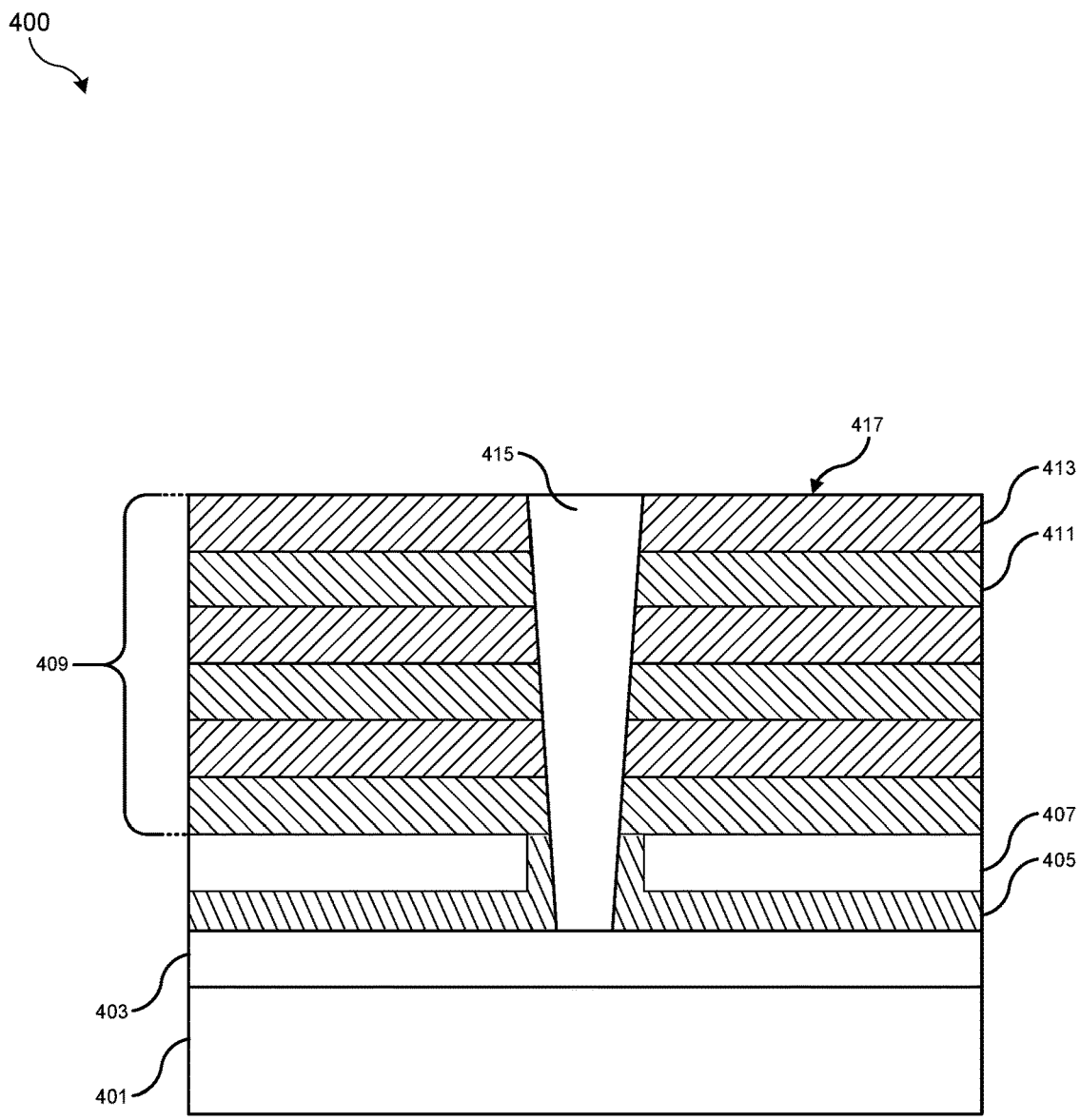
FIGS. 4A-4E illustrate schematic cross-sectional views of substrate materials on which selected operations are being performed according to some embodiments of the present technology.

As illustrated in FIG. 4A, the semiconductor structure 400 may represent a liquid crystal on silicon (LCoS) back-plane comprising one or more constituent structures. As illustrated, structure 400 may include a substrate 401 made of or containing silicon or some other semiconductor substrate material, on which the one or more structures of the LCoS back-plane may be formed. For example, structure 400 may include an underlining metal layer 403, formed, for example, from copper or another metal compatible with semiconductor processing techniques. Structure 400 may further include a reflective and conductive mirror layer 407 that may be or include aluminum, copper, or another reflective metal suitable for providing a mirror surface. To electrically insulate the mirror layer 407 from the underlining metal layer 403, a spacer material 405 may be formed overlying the underlining metal layer 403 prior to forming the conductive mirror layer 407. As illustrated, a distributed Bragg reflector 409 (DBR) may be formed overlying the conductive mirror layer 407. The DBR 409 may include multiple alternating layers of high-k and low-k dielectric materials. For example, low-k layers 411 may be or include a low-k dielectric material, such as silicon oxide or organosilicate glass. By contrast, high-k layers 413 may be or include a high-k dielectric material, such as tantalum oxide. For further implementation in LCoS devices, the semiconductor structure may include a pixel via 415. As illustrated, the pixel via 415 may extend from an upper surface 417 of the structure 400 and contact the underlining metal layer 403, which may provide a conductive path between the underlining metal layer 403 and the upper surface 417, through an aperture in the conductive mirror layer 407 and the DBR 409. As described in more detail in reference to the forthcoming figures, the pixel via 415 may be or include a metal or a refractory material selected for suitability with downstream processing operations such as high-temperature deposition and reactive ion etching.

In some embodiments, the DBR 409 may be formed such that the upper surface 417 of the structure 400 is a high-k layer 413. As an illustrative example, the DBR 409 may be formed such that a low-k layer 411 contacts the conductive mirror layer 407, over which a high-k layer 413 is formed, and paired layers are formed thereafter such that the upper surface 417 may be a surface of a high-k layer 413. In some embodiments, the performance of the DBR as a reflective structure may be affected by a thickness of the high-k layer 413 that forms the upper surface 417. For example, the structure 400 may exhibit a characteristic reflectance across one or more wavelength ranges in the visible spectrum between 400 nm and 700 nm. For example, the structure 400 may exhibit a thickness-dependent reflectance minimum between 400 nm and 450 nm, corresponding to the range of wavelengths visible as the color blue. In such cases, variation of the thickness of the upper high-k layer 413 in a range of 10%-50% of a designated thickness may result in a variation in reflectance of the structure 400 in a range of 5%-30% reflectance as a function of wavelength. As such, precise control of the thickness of the upper high-k layer 413 may provide numerous advantages including, but not limited to, improved optical performance of the structure 400 as an LCoS back-plane, or improved consistency of fabrication with respect to pixel isolation features on a wafer scale, as described in more detail below.

Figure 4B:
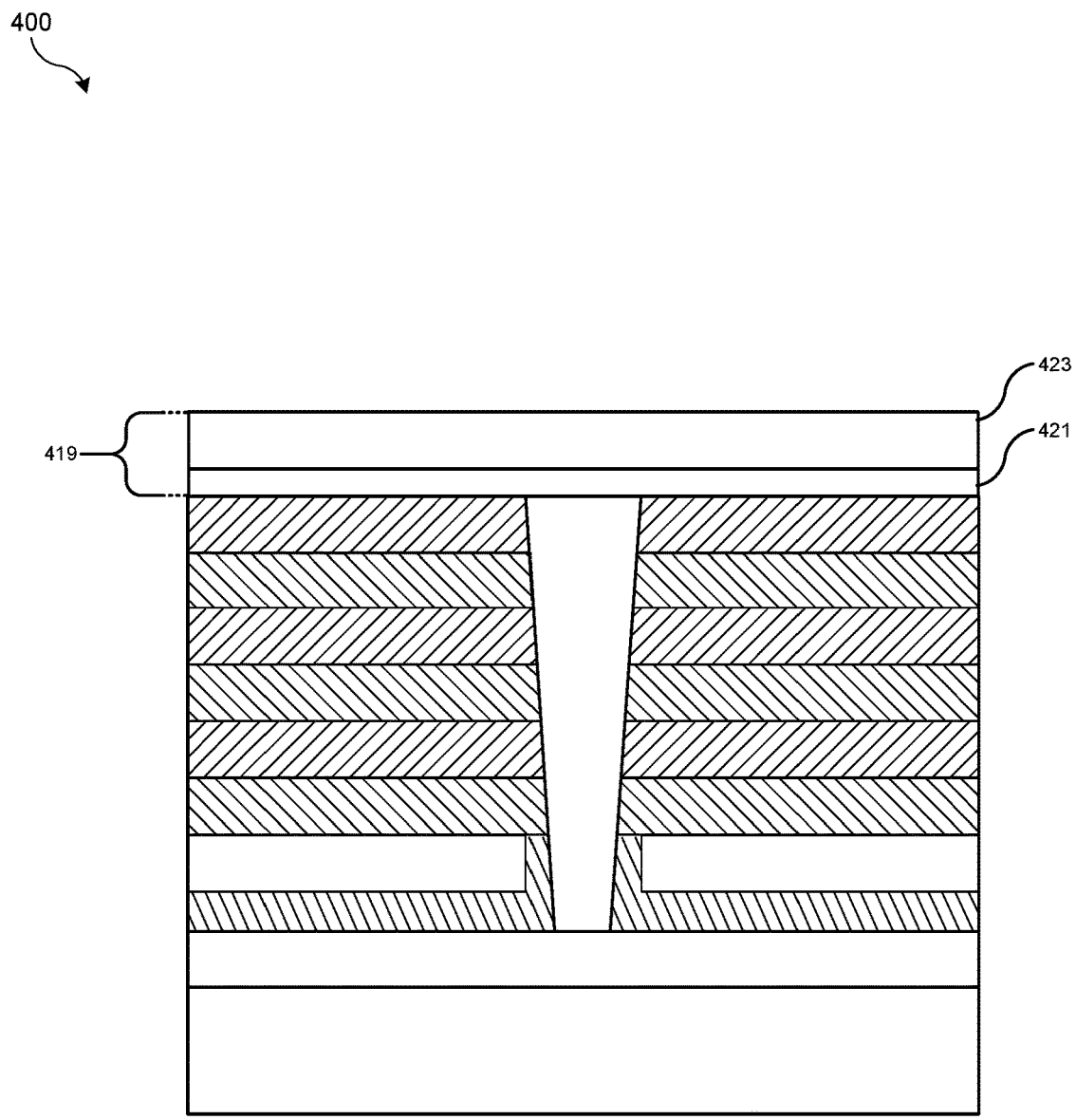

At operation 305, a pixel isolation bilayer 419 may be formed over the exposed structures as illustrated in FIG. 4B. As illustrated, the pixel isolation bilayer 419 may at least partially cover the DBR 409, the pixel via 415, or both. The pixel isolation bilayer 419 may include a stopping layer 421 and a high-k layer 423. In some embodiments, the high-k layer 423 may overly the stopping layer 421, such that the stopping layer 421 and the high-k layer 423 form a conformal bilayer covering the DBR 409 and the pixel via 415. As described above, the stopping layer 412 may be included in the pixel isolation bilayer 419 to facilitate one or more improvements to defining a pixel on the semiconductor structure. For example, the stopping layer 421 may be or include an etch-stop material. In some embodiments, the stopping layer 421 may be or include a diffusion barrier material, for example, as when the pixel via 415 may be or include a non-refractory metal, such as aluminum, cobalt, or copper.

In some embodiments, the etch-stop material may be selected to have a composition whereby, when removed from the surface by reactive ion etching, the etch-stop material may generate a characteristic OES signal. The characteristic OES signal may also be referred to as an end-point signal, and may be different from an OES signal generated by the high-k layer 423 when exposed to the same or similar reactive ion etching process. The etch-stop material may be or include carbon or nitrogen containing compounds including, but not limited to, silicon carbide, silicon nitride, or silicon carbon nitride. In such cases, the end-point signal may include characteristic spectrum components, such as peaks or bands generated by carbon, nitrogen, carbon or nitrogen compounds, or other excited species produced by etching the etch-stope material.

In some embodiments, the diffusion barrier material may be or include nitrides of titanium or tantalum, for example, when the pixel via 415 includes metals such as copper, cobalt, or aluminum. In semiconductor processing operations, such materials can be thermally stable and may not react with the pixel via 415. Other potential diffusion barrier materials for the semiconductor structure may be or include other binary nitrides including, but not limited to tantalum carbide, tungsten carbon nitride, tantalum carbon nitride, oxides of one or more of the preceding metals, silicon nitride, silicon carbon nitride, or ruthenium. In some cases, the aforementioned materials may exhibit barrier properties at layer thicknesses less than 3 nm, less than 5 nm, less than 15 nm, or larger, depending on one or more properties of the semiconductor operations.

Figure 4C:
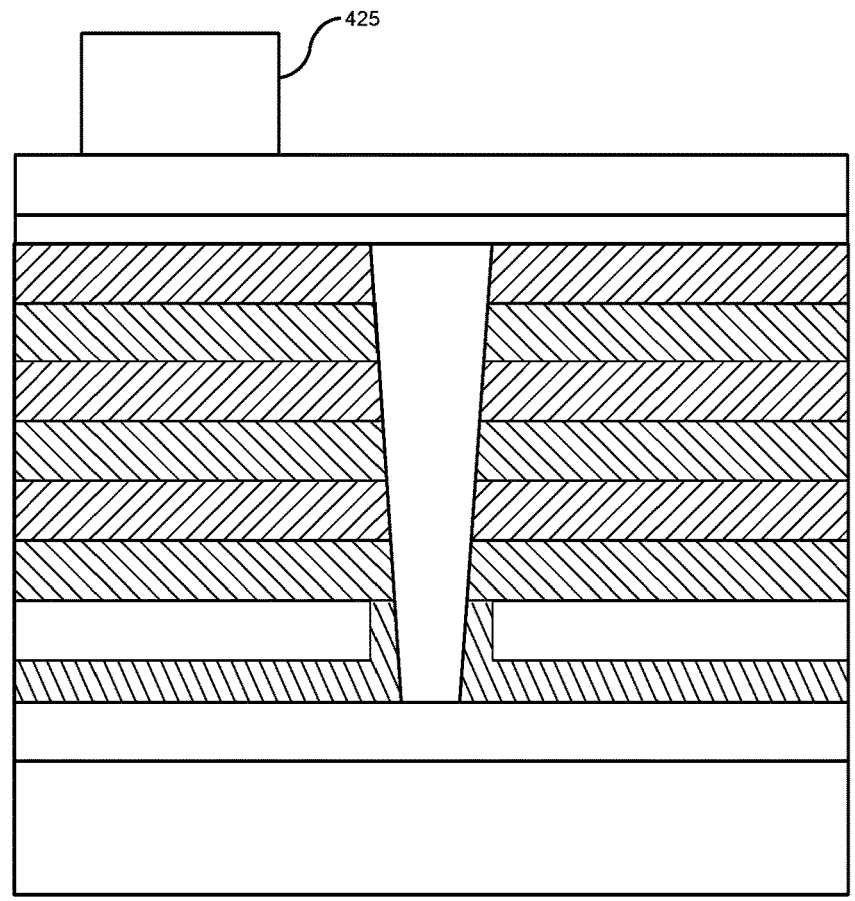

Subsequent formation of the pixel isolation bilayer, a lithographic mask 425 may be formed at operation 310, as illustrated in FIG. 4C. As illustrated, the lithographic mask 425 may be formed over a portion of the pixel isolation bilayer 419. For example, the lithographic mask 425 may be formed over a first region of the pixel isolation bilayer 419, where the first region does not overlie the pixel via 415 beneath. The lithographic mask 425 may be or include a material exhibiting resistance to RIE processes configured to remove the high-k layer 423 and the stopping layer 421 of the pixel isolation bilayer 419, such as tetrafluoromethane, fluoromethane, or other halogen containing gases employed for RIE removal processes. In this way, the lithographic mask 425 may act to shield the underlying layers of the pixel isolation bilayer 419 from subsequent removal operations that define the pixel, as described below. In some cases, the lithographic mask 425 may be or include materials including, but not limited to, metals, silicon oxide, silicon nitride, or a polymeric photoresist, such as maN-2410, maN-2403, or maN-2401.

In some embodiments, forming the lithographic mask 425 may include multiple operations or sub-processes, including but not limited to deposition, lithography, curing, baking, etching, or other processes involved in the preparation of masks for patterned etching. For example, in the case of a metal mask, the method 300 may include sputtering or otherwise depositing a metal thin film onto the surface of the pixel isolation bilayer 419. In another example, in the case of a polymeric mask, the method 300 may include operations for preparing a negative mask including, but not limited to spin coating, uv or e-beam exposure to elicit cross-linking, removing material that has not been cross-linked, curing, baking, as well as other processes involved in forming a polymer photoresist mask. Operation 310 may be applied across an entire wafer, by which the lithographic mask 425 may be formed in many repeats over a wafer-scale substrate in a single set of operations. As described above, the method 300 may therefore include forming multiple lithographic masks 425 across multiple regions of a wafer including multiple semiconductor structures, as an approach for defining multiple pixels on a single silicon wafer.

In some embodiments, forming the lithographic mask 425 at operation 310 may include elevated temperatures at which metal atoms exhibit increased diffusion in the semiconductor materials making up the semiconductor structure 400. As described above, the stopping layer 421 may be or include materials selected to provide a diffusion barrier to metal atoms that may reduce diffusion at operation 310. In some embodiments, diffusivity of metals at the temperatures employed at operation 310 may serve to limit the materials from which the pixel via 415 can be formed. For example, the pixel via 415 material may be or include a refractory metal, such as tungsten, or a ceramic material to limit diffusion or oxidation during formation of the lithographic mask 425. In some embodiments, selecting a refractory metal or a ceramic material for the pixel via 415 may reduce the optical performance of the structure 400 relative to a copper or aluminum pixel via 415, due at least in part to a lower reflectivity of refractory metals and ceramic materials. In this way, providing a stopping layer 421 between the high-k layer 423 and the DBR 409 may permit the use of non-refractory metals in forming the pixel via 415. Advantageously, a non-refractory metal, such as copper, cobalt, or aluminum, may improve the optical performance of the structure 400, and the present technology may limit or prevent oxidation of a top surface of the metal during an etch of the high-k layer 423.

Figure 4D:
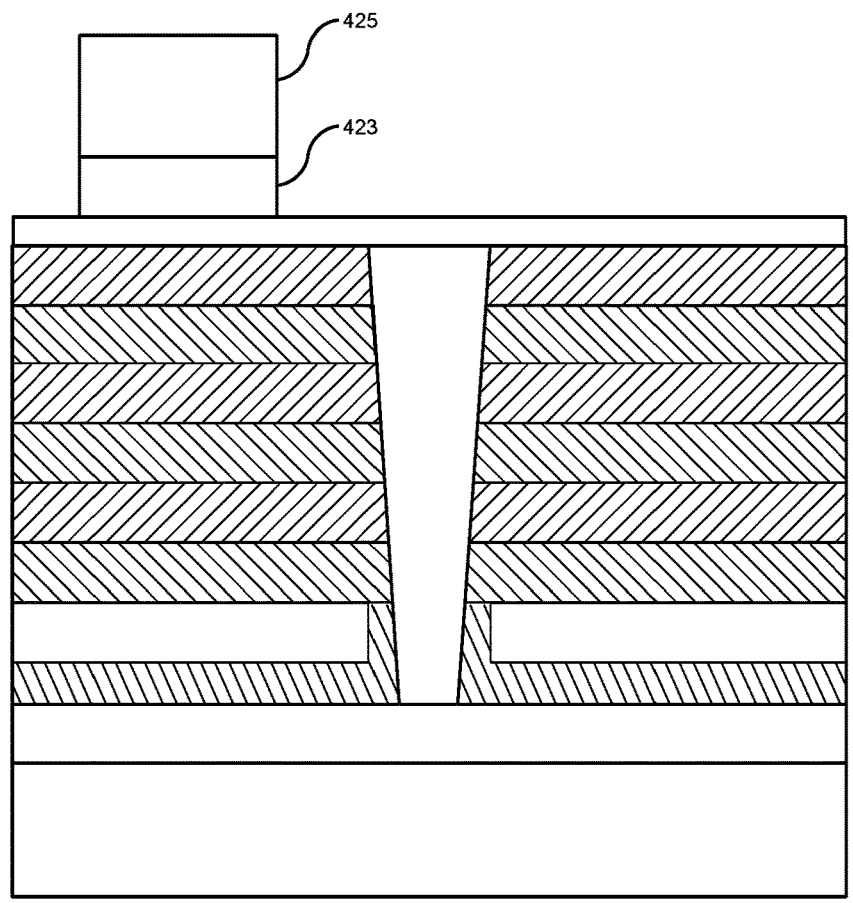
Figure 4E:
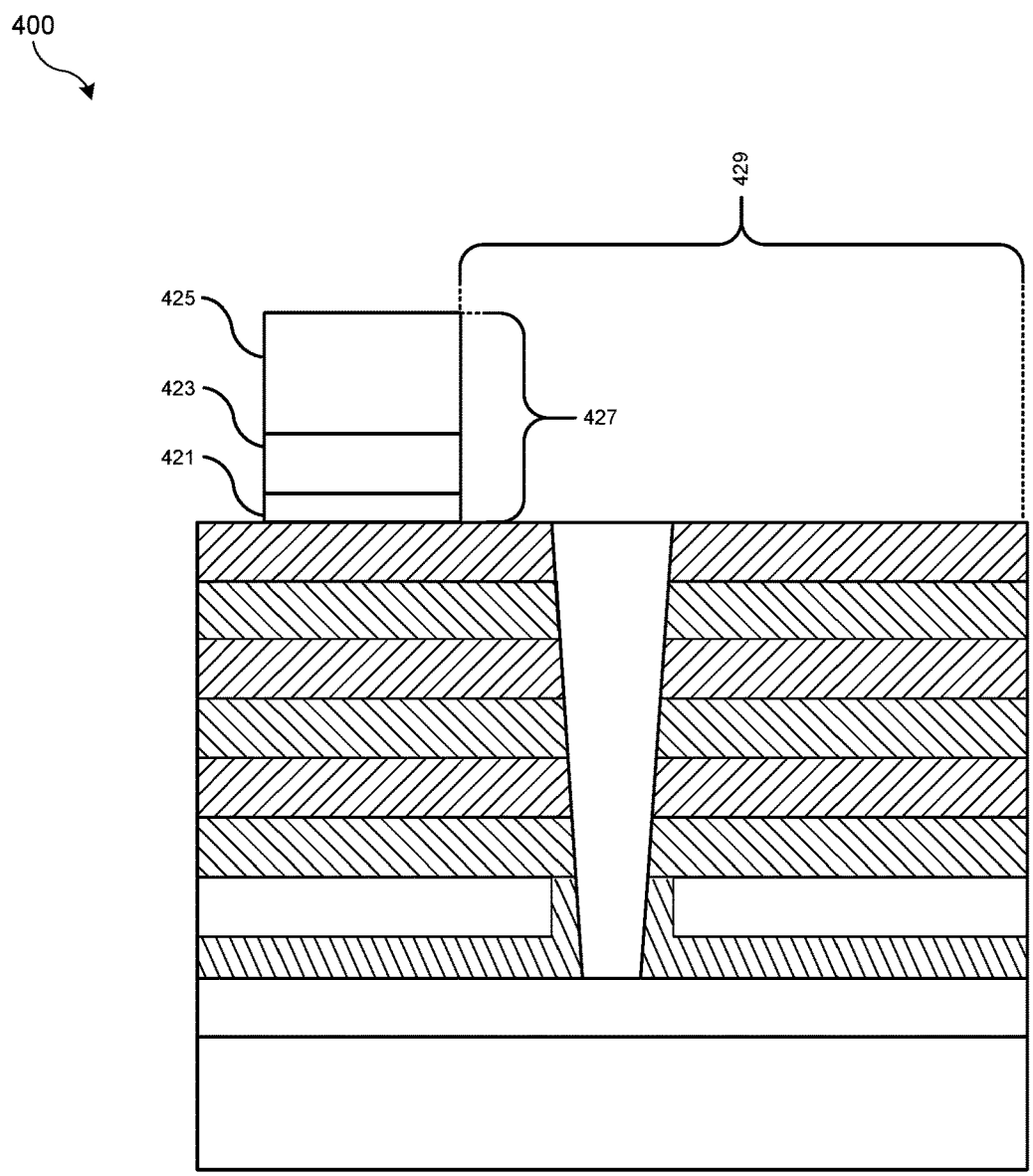

Subsequent forming the lithographic mask 425 at operation 310, one or more removal operations may be performed at operation 315 to form a pixel isolation structure 427, as illustrated in FIG. 4D-E. Operation 315 may include exposing the upper surface of the DBR 409 and revealing the pixel via 415, thereby defining a pixel, as illustrated in FIG. 4E. The removal may be effected by one or more RIE processes performed in chamber 100 previously described, which may allow controlled anisotropic removal first of the high-k layer 423 and second of the stopping layer 421. The process may be performed using a dry etch process utilizing a plasma or remote plasma, which may produce plasma effluents of a halogen-containing precursor, such as, for example, a fluorine-containing precursor, or a chlorine-containing precursor. For example, the halogen-containing precursor may be or include tetrafluoromethane or fluoromethane. The process may also utilize a hydrogen-containing precursor in embodiments or an oxygen-containing precursor in embodiments, which may also be included in the remote plasma or may bypass the remote plasma to interact with radical halogen-containing plasma effluents in the processing region. The process may be performed below about 10 Torr in embodiments, and may be performed below or about 5 Torr in embodiments. The process may also be performed at a temperature below about 100° C. in embodiments, and may be performed below about 50° C.

In some embodiments, the process may anisotropically remove the high-k layer 423 and a portion of the stopping layer 421 using an oxide-selective etch. The oxide-selective etch may be performed at least slightly selective to the high-k layer 423 relative to the stopping layer 421. In some embodiments, the oxide-selective etch may include a halogen precursor such as tetrafluoromethane. In this way, rather than being unaffected by the oxide-selective etch, the stopping layer 421 may be removed at a lower etch rate than the high-k layer 423. A second RIE chemistry or set of operating parameters may subsequently be applied to selectively remove the stopping layer 421 without significant removal of material from the DBR 409 or the pixel via 415. For example, to remove the stopping layer 421 with a selectivity of greater than or about 5:1, greater than or about 10:1, greater than or about 40:1 or greater, a hydrogen containing precursor may be introduced to the chamber 100. In some embodiments, the hydrogen containing precursor may be or include, but is not limited to, fluoromethane.

The transition point from the first RIE chemistry to the second RIE chemistry may be determined, measured, or detected in one or more ways. For example, one approach may include spectroscopic measurement of optical emission produced by etch byproducts in the plasma, as described in more detail, below. As another example, the depth of the etch may be estimated using an average etch rate. In such cases, the reduced etch rate of the stopping layer 421 relative to the high-k layer 423 may provide a window of time to switch RIE chemistry, after the high-k layer 423 has been removed and without over-etching into the DBR 409. In another example, interferometric techniques may be employed at one or more time points, for example, integrated with a pulsed plasma source for progressive measurement, to measure etch depth as a function of time. In this way, the high-k layer 423 may be removed and the stopping layer 421 may be partially removed, after which the RIE chemistry may be switched to selectively remove the stopping layer 421 without over-etching into the DBR 409.

The second etch may be selective to the stopping layer 421 over the upper surface 417 of the DBR 409. For example, the selectively may be greater than or about 5:1, greater than or about 10:1, greater than or about 40:1, greater than or about 100:1, or greater, and may permit the removal of the stopping layer 421 as illustrated in FIG. 4E. Furthermore, inclusion of the stopping layer 421, coupled with the selectivity of the second etch, may also provide improved over-etch uniformity and a smaller relative over-etch delta value for operation 315 on a wafer scale. Additionally, the chemistry of the second etch may include one or more hydrogen components, as discussed above, which may be included to limit or prevent oxidation of the underlying pixel via material during the second etch.

In some cases, over-etch may describe one or more characteristics of a semiconductor surface feature, such as the pixel isolation structure 427, whereby the dimensions of the feature resulting from the formation and removal operations are measured, as by ex-situ electron microscopy. For example, the height of the pixel isolation structure 427 relative to the substrate 401 may be compared to the height the DBR 409 relative to the substrate 401 to estimate the over-etch. In some embodiments, the over-etch for the structure 400 that includes the pixel isolation bilayer 419 may be less than 5 nm, less than 4 nm, less than 3 nm, less than 2 nm, or less than 1 nm. In some embodiments, the over-etch for the structure 400 that includes the pixel isolation bilayer 419 may be less than the variability in the dimensions of the DBR 409, and, as such, may be negligible or approach 0 nm.

For a wafer scale process, non-uniformity of removal processes from a central location on the wafer to a peripheral location on the wafer may negatively impact the quality of the resulting semiconductor structure. As such, the center-to-edge over-etch delta, which describes the precision of removal processes on a wafer scale, may indicate an improved removal process from the perspective of process uniformity, and thus may produce a semiconductor structure with improved optical performance at both the center location and the peripheral location. Improved process uniformity may provide numerous advantages, such as improved device yield per wafer, reduced resource demand per device, reduced waste, or reduced resource consumption on a process scale.

In some embodiments, the techniques described herein as part of method 300 may result in improved center-to-edge over-etch delta values relative to methods and structures without a pixel isolation bilayer 419. For example, the center-to-edge over-etch delta value for a structure without the pixel isolation bilayer 419 may be greater than 5 nm. By contrast, the center-to-edge over-etch delta value for a structure incorporating the pixel isolation bilayer 419 may be less than 5 nm, less than 4 nm, less than 3 nm, less than 2 nm, or less than 1 nm. In some embodiments, the center-to-edge over-etch delta value for a structure incorporating the pixel isolation bilayer 419 may be less than the variability in the dimensions of the DBR, and, as such, may be negligible or approach 0 nm. Embodiments of the semiconductor structure 400, incorporating the pixel isolation bilayer 419, may provide an edge thickness that is greater than or about 50% of a center thickness subsequent removal of the pixel isolation bilayer, and may be greater than or about 60%, greater than or about 70%, greater than or about 80%, greater than or about 90%, greater than or about 95%, greater than or about 99%, or the edge thickness may be substantially similar to or identical to the center thickness in some embodiments.

Forming the pixel isolation structure, as in operation 315, may include one or more additional operations to provide end-point controlled removal of the pixel isolation bilayer 419 at operation 315, as illustrated in FIG. 4D-4E. In some embodiments, operation 315 may include operation 320, whereby a first etch is performed to anisotropically remove at least a portion of the high-k layer 423 to expose lateral features, such as an upper surface, of the stopping layer 421 while maintaining portions of the high-k layer 423 overlying the stopping layer 421 and underlying the lithographic mask 425.

In some embodiments, operation 310 may include detecting optical emission in the chamber 100 at operation 325. In the context of operation 325, optical emission spectroscopy (OES) describes a technique for measuring stimulated emission from atomic and molecular species in a plasma, whereby excited plasma species emit light at characteristic wavelengths during spontaneous de-excitation processes. OES techniques can be applied to identify constituent plasma species, for example, by spectral analysis against calibrated standard spectra or simulated spectra. OES measurement at operation 325 may be implemented while the first etch is performed at operation 320. In some cases, this may permit progressive measurement of OES spectra, for example, to more precisely detect an endpoint signal of the first etch process.

During the first RIE of operation 320, an OES spectrum collected at one or more time points will provide information about excited species in the plasma, which may include, but is not limited to, etch products of the stopping layer 421, the high-k layer 423, the DBR 409, or the pixel via 415. In some embodiments, as when the DBR 409 and the high-k layer 423 may be or include the same dielectric materials, such as tantalum oxide, OES spectrum information may produce the same result for both structures. As such, the upper surface 417 of the DBR 409 may be minimally differentiable from the high-k layer 423 through OES measurements. In contrast, the stopping layer 421, which may be or include a material selected to produce an highly differentiable OES spectrum from that of the high-k layer 423 or the upper surface 417 of the DBR 409, may be readily identified during the first etch process of operation 315. In an illustrative example, a high-k layer 423 including tantalum oxide may produce excited tantalum and oxygen species in the RIE plasma that emit light at one or more characteristic wavelengths, which may be detected in OES during the first etch process. In an example where the stopping layer 421 may be or include silicon carbon nitride, however, the stopping layer 421 may produce carbon, nitrogen, silicon excited species that may emit light at different characteristic wavelengths. As such, removal of the high-k layer 423 by RIE may be readily differentiated from removal of the stopping layer 421 by OES.

In some embodiments, operation 315 may optionally include performing a second etch at operation 330, to partially remove the stopping layer 421 and to define a pixel 429 as illustrated in FIG. 4E. Operation 330 may include changing precursor gases in the chamber 100, described above, such that the second etch may provide carbon-selective etch or an etch selective towards carbon-containing films, an etch selective to nitride films, or a silicon selective etch. For example, when the stopping layer 421 is or includes silicon carbon nitride, the precursor gas for the second etch may be or include a hydrogen-containing precursor, such as fluoromethane, and may include oxygen in some embodiments. The operation 330 may be undertaken subsequent detection of an end-point signal by OES at operation 325. The selectivity of the second etch to the stopping layer 421 may permit the pixel isolation structure 427 to be formed with negligible effect on the DBR 409 beneath. As such, the over-etch may be reduced for the structure 400, and method 300 may provide improved precision of material layer formation and removal processes and may provide devices with improved optical performance, uniformity on a wafer scale, as well as other benefits including, but not limited to, reduced environmental impact and improved process efficiency.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor structure comprising:
   a semiconductor substrate comprising:
   a metal layer;
   a mirror layer overlaying the metal layer;
   a Distributed Bragg Reflector (DBR) overlaying the mirror layer; and
   a pixel via extending from the metal layer to an upper surface of the DBR;
   a stopping layer overlying a first region of the semiconductor substrate;
   a high-k layer overlying the stopping layer; and
   a lithographic mask overlying the high-k layer.

2. The semiconductor structure of claim 1, wherein the stopping layer comprises an etch-stop material selected to generate, during a reactive ion etch process of the stopping layer, an optical emission spectroscopy (OES) signal of the stopping layer different from an OES signal of the high-k layer.

3. The semiconductor structure of claim 1, wherein the stopping layer comprises silicon carbon nitride.

4. The semiconductor structure of claim 1, wherein the semiconductor substrate comprises a liquid crystal on silicon (LCoS) back-plane.

5. The semiconductor structure of claim 1, wherein the pixel via comprises a tungsten pixel via.

6. The semiconductor structure of claim 1, wherein the high-k layer comprises tantalum oxide.

7. The semiconductor structure of claim 1, wherein the semiconductor structure exhibits an edge thickness that is greater than or about 80% of a center thickness.

8. A semiconductor structure comprising:
   a semiconductor substrate comprising:
   a metal layer;
   a mirror layer overlaying the metal layer;
   a Distributed Bragg Reflector (DBR) overlaying the mirror layer; and
   a pixel via extending from the metal layer to an upper surface of the DBR;
   and
   a pixel isolation bilayer comprising:
   a barrier layer overlying the semiconductor substrate; and
   a high-k layer overlying the barrier layer.

9. The semiconductor structure of claim 8, wherein the pixel via comprises a non-refractory metal.

10. The semiconductor structure of claim 8, wherein the pixel via comprises aluminum or copper.

11. The semiconductor structure of claim 8, wherein the barrier layer comprises a material selected to provide a barrier to diffusion of oxygen into the pixel via during a reactive ion etch process, and to provide a barrier to diffusion of atoms from the pixel via into the high-k layer during a deposition process.

12. The semiconductor structure of claim 8, wherein the barrier layer comprises tantalum nitride.

13. The semiconductor structure of claim 8, wherein the high-k layer comprises tantalum oxide.

* * * * *